United States Patent
Lee et al.

(10) Patent No.: US 8,994,002 B2
(45) Date of Patent: Mar. 31, 2015

(54) FINFET HAVING SUPERLATTICE STRESSOR

(75) Inventors: Yi-Jing Lee, Hsin-Chu (TW); You-Ru Lin, New Taipei (TW); Cheng-Tien Wan, Tainan (TW); Cheng-Hsien Wu, Hsin-Chu (TW); Chih-Hsin Ko, Fongshan (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 13/422,531

(22) Filed: Mar. 16, 2012

(65) Prior Publication Data
US 2013/0240836 A1 Sep. 19, 2013

(51) Int. Cl.
| | | |
|---|---|---|
| *H01L 21/20* | (2006.01) | |
| *H01L 29/772* | (2006.01) | |
| *H01L 21/335* | (2006.01) | |
| *H01L 29/10* | (2006.01) | |
| *H01L 29/165* | (2006.01) | |
| *H01L 29/267* | (2006.01) | |
| *H01L 29/78* | (2006.01) | |
| *H01L 29/51* | (2006.01) | |

(52) U.S. Cl.
CPC .......... *H01L 29/267* (2013.01); *H01L 29/1054* (2013.01); *H01L 29/165* (2013.01); *H01L 29/517* (2013.01); *H01L 29/785* (2013.01)
USPC ............. 257/19; 257/190; 257/194; 438/478; 438/510; 438/151

(58) Field of Classification Search
USPC .................... 257/14, 15, 18, 19, 20, E29.024; 438/478, 510
See application file for complete search history.

(56) References Cited

U.S. PATENT DOCUMENTS

| | | | | |
|---|---|---|---|---|
| 5,019,874 | A * | 5/1991 | Inoue et al. | 257/190 |
| 5,357,119 | A * | 10/1994 | Wang et al. | 257/18 |
| 5,629,231 | A | 5/1997 | Kiehl | |
| 6,369,438 | B1 * | 4/2002 | Sugiyama et al. | 257/616 |
| 6,515,335 | B1 * | 2/2003 | Christiansen et al. | 257/347 |
| 6,534,385 | B2 * | 3/2003 | Park et al. | 438/459 |
| 7,091,561 | B2 * | 8/2006 | Matsushita et al. | 257/347 |
| 7,154,118 | B2 * | 12/2006 | Lindert et al. | 257/66 |
| 7,569,869 | B2 * | 8/2009 | Jin et al. | 257/190 |
| 7,629,603 | B2 * | 12/2009 | Chui et al. | 257/18 |
| 7,781,771 | B2 * | 8/2010 | Lindert et al. | 257/66 |
| 7,888,201 | B2 * | 2/2011 | Yeo et al. | 438/238 |
| 7,928,426 | B2 * | 4/2011 | Chui et al. | 257/24 |
| 8,058,692 | B2 * | 11/2011 | Lai et al. | 257/374 |
| 8,242,001 | B2 * | 8/2012 | Pillarisetty et al. | 438/478 |
| 8,283,653 | B2 * | 10/2012 | Pillarisetty et al. | 257/20 |
| 8,558,279 | B2 * | 10/2013 | Cea et al. | 257/190 |

(Continued)

FOREIGN PATENT DOCUMENTS

| | | |
|---|---|---|
| JP | 11-284220 | 10/1999 |
| KR | 10-0674914 B1 | 1/2007 |

*Primary Examiner* — Steven Loke
*Assistant Examiner* — David Goodwin
(74) *Attorney, Agent, or Firm* — Slater & Matsil, L.L.P.

(57) ABSTRACT

A fin field effect transistor (FinFET) device is provided. The FinFET includes a superlattice layer and a strained layer. The superlattice layer is supported by a substrate. The strained layer is disposed on the superlattice layer and provides a gate channel. The gate channel is stressed by the superlattice layer. In an embodiment, the superlattice layer is formed by stacking different silicon germanium alloys or stacking other III-V semiconductor materials.

20 Claims, 5 Drawing Sheets

(56) References Cited

U.S. PATENT DOCUMENTS

| | | |
|---|---|---|
| 2002/0171077 A1 | 11/2002 | Chu et al. |
| 2005/0023554 A1 | 2/2005 | Chu et al. |
| 2005/0035415 A1* | 2/2005 | Yeo et al. ............... 257/401 |
| 2005/0224800 A1* | 10/2005 | Lindert et al. ............ 257/66 |
| 2006/0076625 A1* | 4/2006 | Lee et al. ............... 257/353 |
| 2006/0292765 A1* | 12/2006 | Blanchard et al. ......... 438/157 |
| 2006/0292889 A1* | 12/2006 | Blanchard et al. ......... 438/761 |

* cited by examiner

FINFET HAVING SUPERLATTICE STRESSOR

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (FinFETs) or multiple gate transistors will be used in sub 32 nm transistor nodes. For example, FinFETs not only improve areal density but also improve gate control of the channel.

In recent years, FinFETs have been constructed with a stressor in order to enhance performance. In some circumstances, the stressor may be formed using silicon germanium (SiGe) grown through a single layer epitaxy process. The stressor may be relaxed using SiGe with a high Ge percentage or by implementing a high temperature anneal process. A gradient Ge percentage of SiGe epitaxy may be used to provide strain.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to preferred embodiments in a specific context, namely a fin field effect transistor (FinFET) metal oxide semiconductor (MOS). The invention may also be applied, however, to other integrated circuits, electronic structures, and the like.

Figure 1:
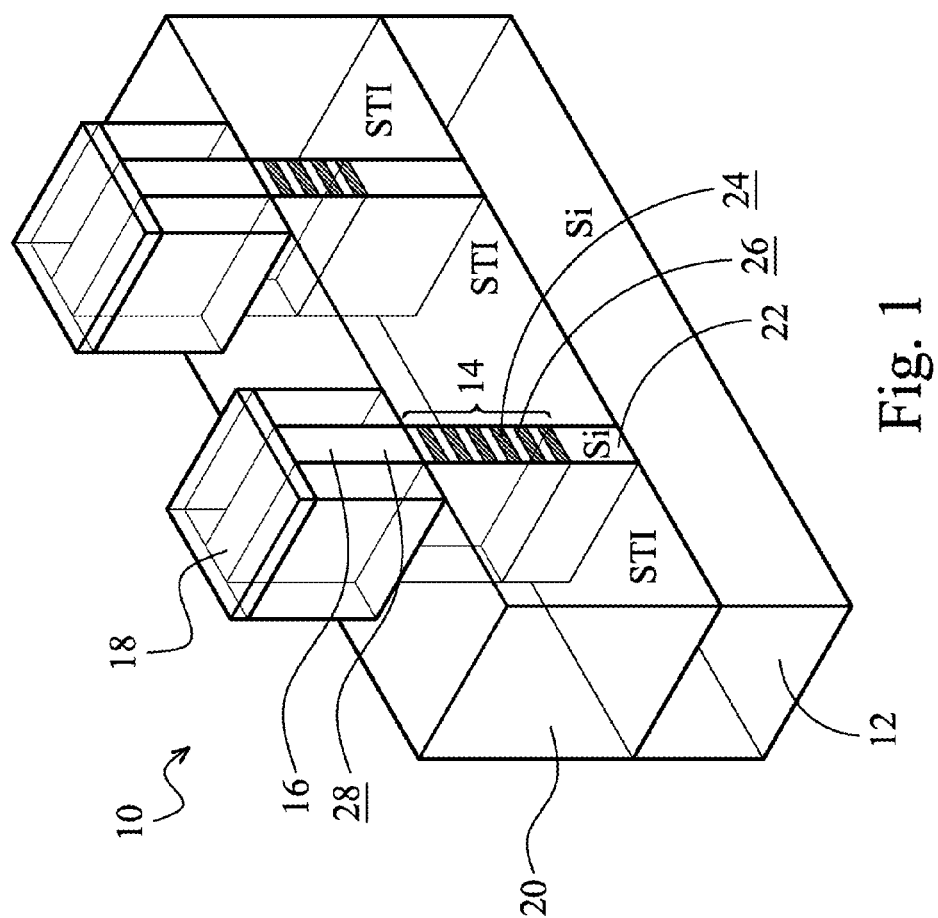
FIG. 1 is a perspective, three dimensional view in partial cross-section illustrating an embodiment fin field effect transistor (FinFET) device with a superlattice layer as a gate channel stressor.

FIG. 1 is a perspective, three-dimensional view in partial cross-section illustrating a FinFET device 10. As will be more fully explained below, the FinFET device 10 includes a gate stressor structure that provides tensile strain to a gate channel, reduces or eliminates emitting stacking faults, provides effective epitaxy relaxation, and functions as a virtual substrate. As shown in FIG. 1, the FinFET device 10 includes a substrate 12, a superlattice layer 14 (a.k.a., superlattice structure), a strained layer 16, and a gate stack 18.

The substrate 12 depicted in FIG. 1 may be formed of from silicon or other suitable semiconductor materials. As shown, the substrate 12 is generally disposed beneath a shallow trench isolation (STI) region 20. As such, the substrate 12 is able to support the STI region 20. In an embodiment, a lower or fin portion 22 of the substrate 12 projects upwardly into the STI region 20.

Still referring to FIG. 1, the superlattice layer 14 is generally supported by the substrate 12. In an embodiment, the superlattice layer 14 is disposed on a fin portion 22 of the substrate 12 as shown in FIG. 1. In an embodiment, the superlattice layer 14 may be constructed or built on top of the substrate 12 instead of the fin portion 22. As will be more fully explained below, the superlattice layer 14 functions as a gate stressor for the FinFET device 10.

The superlattice layer 14 is generally formed by stacking different semiconductor materials in an alternating format. As shown in FIG. 1, the superlattice layer 14 includes a first semiconductor material 24 and a second semiconductor material 26. In an embodiment, each of the first and second semiconductor materials 24, 26 are formed from an alloy of silicon germanium (SiGe). In an embodiment, each of the first and second semiconductor materials 24, 26 are formed from a III-V semiconductor material. In an embodiment, the superlattice layer 14 is entirely or substantially embedded in, or encapsulated by, the STI region 20.

Still referring to FIG. 1, the strained layer 16 is generally formed from a semiconductor material. As shown in FIG. 1, the strained layer 16 is formed from a third semiconductor material 28. In an embodiment, the third semiconductor material 28 is formed from an alloy of silicon germanium (SiGe). In an embodiment, the third semiconductor material 28 is formed from a III-V semiconductor material. In an embodiment, the strained layer 16 is entirely disposed above the STI region 20. In other words, the strained layer 16 projects above the STI region 20. In an embodiment, the first and third semiconductor materials 24, 28 are each formed from the same semiconductor material (e.g., the same alloy of silicon germanium).

The gate stack 18 is generally formed over the strained layer 16. As shown in FIG. 1, the gate stack 18 is formed over a portion of the STI region 20, along sidewalls and a top surface of the strained layer 16, and then on an opposing portion of the STI region 20. In an embodiment, the gate stack 18 substantially or entirely encapsulates the strained layer 16. In an embodiment, the gate stack 18 is formed from, for example, an interfacial oxide layer, a high-k value dielectric layer, and a metal layer.

Various materials may be used to form the dielectric portions of the gate stack 18 such as, for example, hafnium oxide ($HfO_2$), zirconium oxide ($ZrO_2$), or other suitable gate dielectric materials that have a desirably high dielectric constant k, i.e., higher than that of silicon dioxide ($SiO_2$). Various suitable thicknesses may be used and are chosen in conjunction with device speed and application. In an embodiment, the gate stack 18 is formed using polysilicon. In an embodiment, the gate stack 18 may be formed from other suitable metals and dielectric materials.

Figure 2:
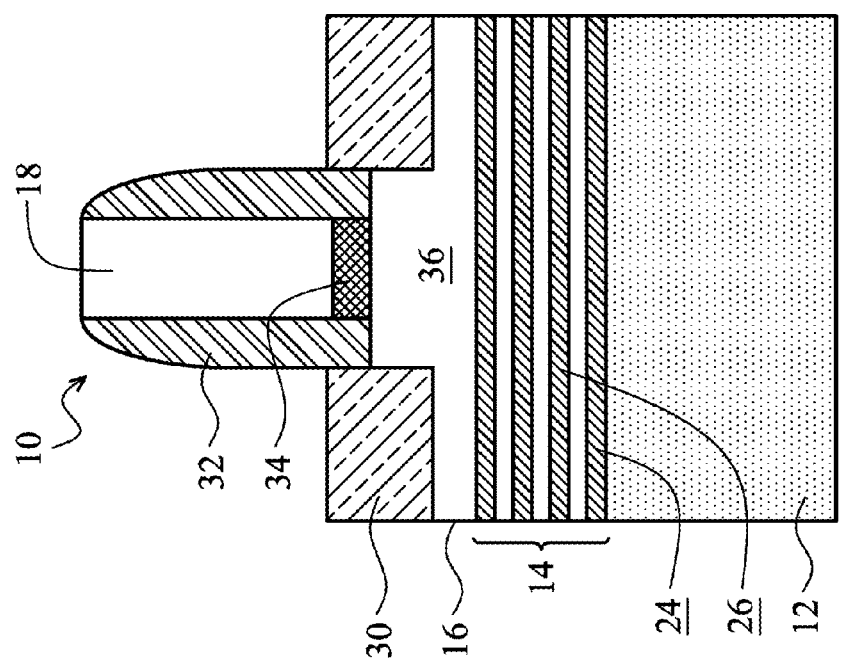
FIG. 2 is a cross section of an embodiment of the FinFET device of FIG. 1 illustrating further device elements.

Referring now to FIG. 2, an embodiment of the FinFET device 10 illustrates further device elements. For example, the FinFET device 10 includes source/drain contacts 30, spacers 32 abutting the gate stack 18, and a hard mask 34. As shown, the source/drain contacts 30 are embedded in the strained layer 16. The source/drain contacts 30 are also disposed on opposing sides of a gate channel 36 (a.k.a., a transistor channel) of the FinFET device 10. In other embodiments, the source/drain contacts 30 may be otherwise oriented or configured.

The gate channel 36 is generally stressed by the superlattice layer 14 of FIG. 1. In other words, the superlattice layer 14 produces stress in the gate channel 36. In an embodiment, the superlattice layer 14 generates a tensile stress in, for example, an n-channel NMOS SiGe gate channel 36. In other embodiments, the superlattice layer 14 may be formed from suitable materials or processes to form stress in other types of gate channels. In an embodiment, the superlattice layer 14 may provide compressive stress to the gate channel 36. In addition to providing stress to the gate channel 36, the superlattice layer 14 is also able to inhibit or prevent emitting stacking faults. Indeed, the superlattice layer 14 generally provides stacking fault free epitaxy and effective epitaxy relaxation. In an embodiment, the superlattice layer 14 may be considered a virtual substrate gate stressor.

Still referring to FIG. 2, the hard mask 34 is formed beneath the gate stack 18. The hard mask 34 is generally a high-k dielectric material. In an embodiment, the hard mask 34 is formed from, for example, a high-k dielectric. As shown in FIG. 2, the gate spacers 32 are supported from below by the strained layer 16. In addition, each of the gate spacers 32 is interposed between one of the source/drain contacts 30 and the hard mask 34. In an embodiment, the gate spacers 32 may be otherwise configured or oriented. In an embodiment, the hard mask 34, the gate spacers 32, or both may be formed from or include an oxide, a nitride, an oxynitride, a high-K dielectric like $Ta_2O$, $Al_2O_3$, HfO, $SiTiO_3$, HfSiO, HfSiON, ZrSiON, and combinations thereof.

Figure 3:
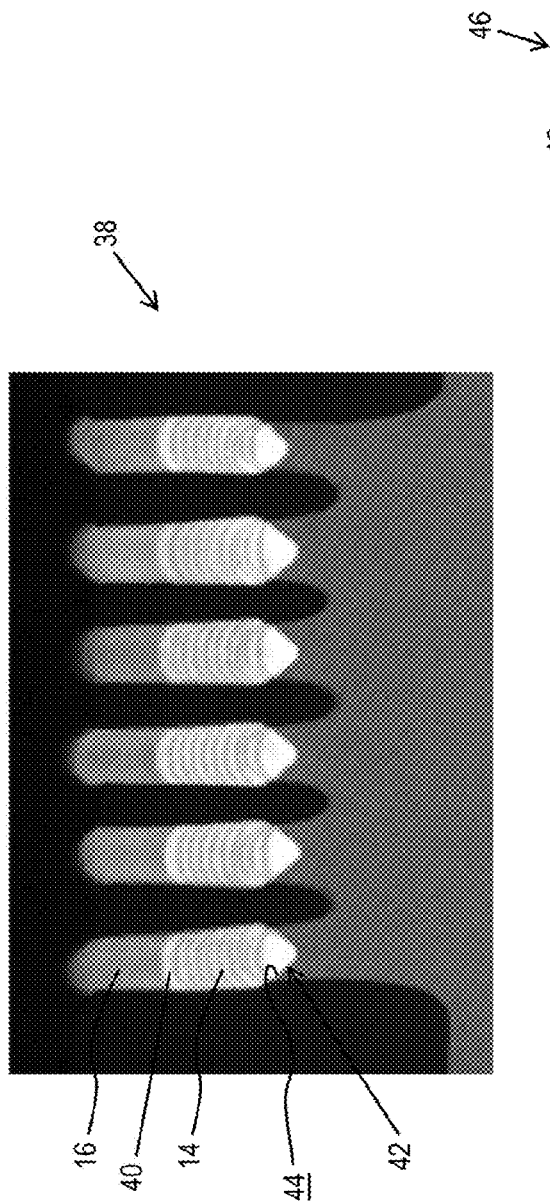
FIG. 3 is a transmission electron microscope (TEM) image depicting several adjacent fins from a FinFET device similar to the FinFET device of FIG. 1.

Referring now to FIG. 3, a transmission electron microscope (TEM) image 38 depicts several adjacent fins 40 of the FinFET device 10. As shown, each of the fins 40 includes one of the strained layers 16 disposed over, or stacked upon, one of the superlattice layers 14. In an embodiment, the superlattice layer 14 is deposited in, or supported by, a v-groove 42 of the substrate 12. In an embodiment, the superlattice layer 14 engages the substrate 12 at a (111) surface 44 of the substrate 12.

Figure 4:
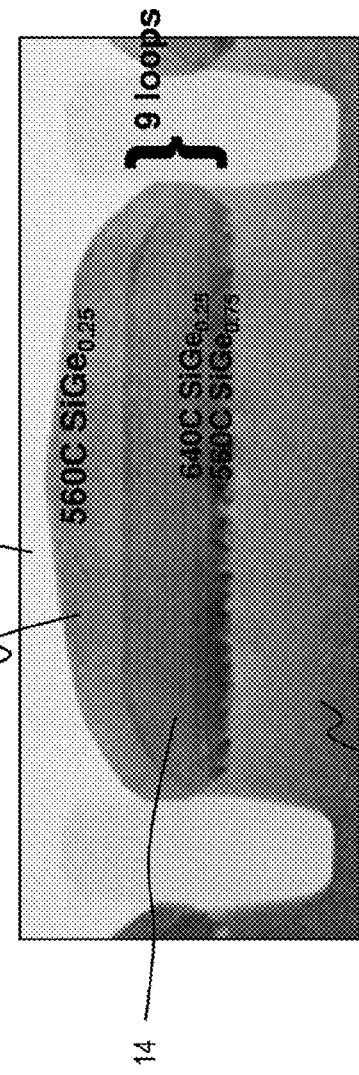
FIG. 4 is a TEM image illustrating a cross section of one of the fins of FIG. 3.

FIG. 4 is a TEM image illustrating a cross section of one of the fins 40 of the FinFET device 10 of FIG. 3. As shown in FIG. 4, the superlattice layer 14, which is disposed on the substrate 12, is formed from alternating silicon germanium alloys. In an embodiment, the superlattice layer 14 is formed from nine (9) bands (a.k.a., loops, layers, etc.) of a 560° C. $SiGe_{0.25}$ and 640° C. $SiGe_{0.75}$ stacked upon each other. In an embodiment, more or fewer bands of materials may be stacked or formed upon one another. As shown in FIG. 4, the strained layer 16, which is disposed on the superlattice layer 14, is formed from a 560° C. $SiGe_{0.25}$. In an embodiment, other semiconductor materials (e.g., III-V semiconductor materials) with other melting temperatures (e.g., between about 400° C. and about 700° C.) may also be used or incorporated into the strained layer 16 and the superlattice layer 14.

Figure 5:
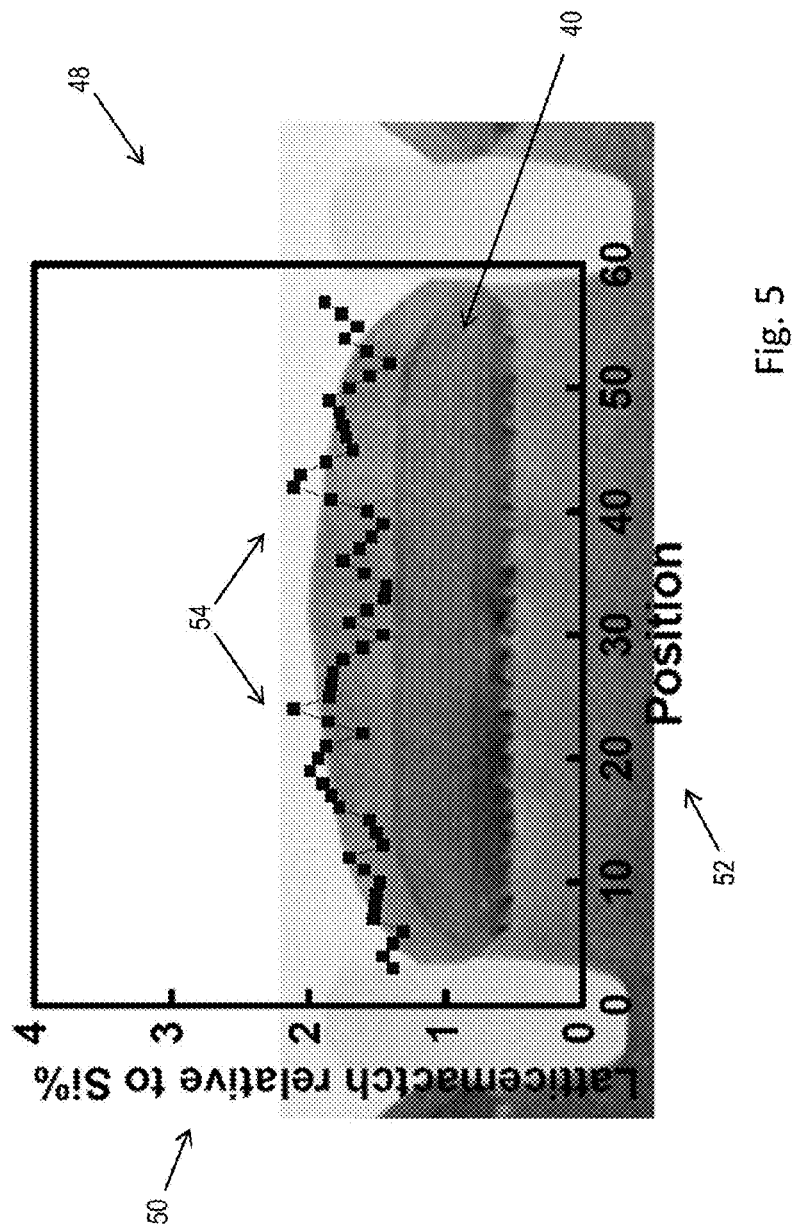
FIG. 5 is a graphical representation of the strain analysis of the fin of FIG. 3.

Referring now to FIG. 5, a graph 48 representing a strain analysis of the fin 40 of FIG. 3. As shown in FIG. 5, the lattice match relative to the percentage of silicon (Si%) 50 is provided on the vertical axis (i.e., the y-axis) of the graph 48. In addition, a position 52 along the fin 40 is provided on the horizontal axis (the x-axis) of the graph 48. The position 52 represents a set of points along a horizontal distance, not a specific unit of measurement (e.g., nanometers). As illustrated by the various data points 54 in the graph 48, the lattice match relative to Si% 50 is between about one (1) and about two (2) over the entire fin 40 between position zero (0) and position sixty (60).

Figure 6:
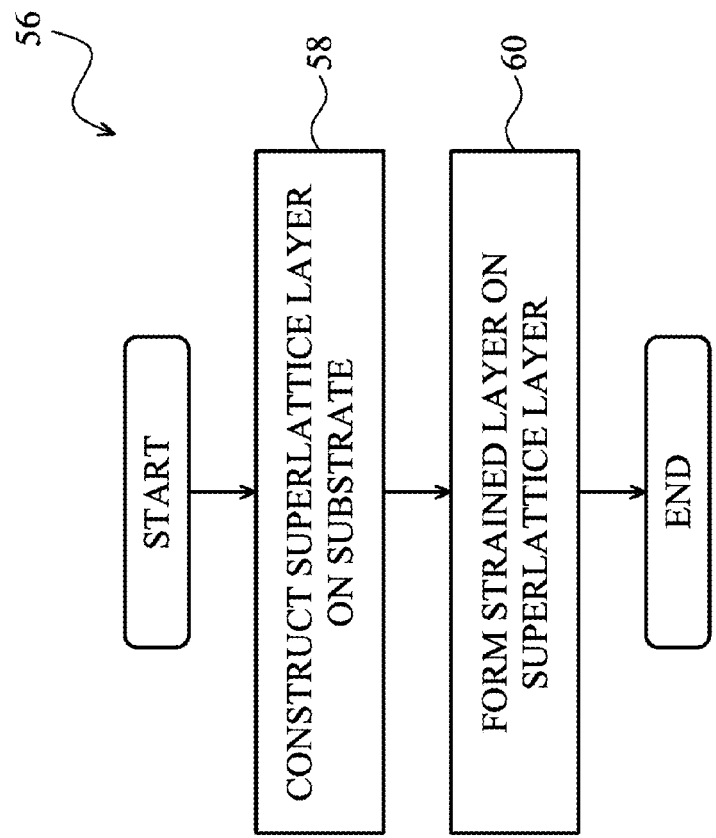
FIG. 6 is an embodiment of a method of forming a stressor for the FinFET device of FIG. 1.

Referring now to FIG. 6, a method 56 of forming a stressor for the FinFET device 10 of FIG. 1 is illustrated. In block 58, the superlattice layer 14 is constructed on the substrate 12. In block 60, the strained layer 16 is formed on the superlattice layer 14. The strained layer 16 provides the gate channel 36, which is stressed by the superlattice layer 14. In other words, the superlattice layer 14 functions as the stressor.

A fin field effect transistor (FinFET) device. The device comprises a superlattice layer supported by a substrate, a strained layer disposed on the superlattice layer and providing a gate channel, the gate channel stressed by the superlattice layer.

A field effect transistor (FinFET) device. The device comprises a superlattice layer supported by a substrate, a shallow trench isolation (STI) region encapsulating the superlattice layer, a strained layer disposed on the superlattice layer and providing a gate channel, the gate channel stressed by the superlattice layer, and a gate stack formed over the strained layer.

A method of forming a stressor for a fin field effect transistor (FinFET) device. The method comprises constructing a superlattice layer on a substrate and forming a strained layer on the superlattice layer, the strained layer providing a gate channel, the gate channel stressed by the superlattice layer.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A fin field effect transistor (FinFET) device, comprising:
a superlattice layer disposed over a fin portion of a substrate, the superlattice layer comprising alternating first semiconductor layers and second semiconductor layers, the first semiconductor layers each having a first atomic composition, and the second semiconductor layers each having a second atomic composition different from the first atomic composition, the substrate having a third atomic composition in the fin portion, the first atomic composition and the second atomic composition each being different from the third atomic composition, at least one of the first semiconductor layers or the second semiconductor layers being relaxed; and
a strained layer disposed over the superlattice layer and providing a gate channel, the gate channel stressed by a lattice mismatch with at least one of the first semiconductor layers or the second semiconductor layers of the superlattice layer.

2. The device of claim 1, wherein the first atomic composition is a first silicon germanium alloy, and the second atomic composition is a second silicon germanium alloy.

3. The device of claim 1, wherein the first atomic composition is a first III-V semiconductor material, and the second atomic composition is a III-V second semiconductor material.

4. The device of claim 1, wherein the superlattice layer is disposed in a v-groove of the substrate.

5. The device of claim 1, wherein the superlattice layer engages the substrate at a (111) surface of the substrate.

6. The device of claim 1, wherein the superlattice layer is embedded in a shallow trench isolation (STI) region.

7. The device of claim 1, wherein the superlattice layer is embedded in a shallow trench isolation (STI) region and the strained layer projects above the STI region.

8. The device of claim 1, wherein the superlattice layer generates tensile stress in the gate channel.

9. The device of claim 1, wherein the superlattice layer is configured to reduce emitting stacking faults.

10. The device of claim 1, wherein the strained layer is configured to enhance mobility of the gate channel.

11. The device of claim 1 further comprising a gate stack over the strained layer.

12. The device of claim 1, wherein the strained layer is vertically stacked upon the superlattice layer.

13. A field effect transistor (FinFET) device, comprising:
 a superlattice layer disposed over a fin portion of a substrate, the superlattice layer comprising alternating first semiconductor layers and second semiconductor layers, a material of the first semiconductor layers being different from a material of the second semiconductor layers, a material of the fin portion of the substrate being different from each of the material of the first semiconductor layers and the material of the second semiconductor layers, at least one of the first semiconductor layers or the second semiconductor layers being relaxed;
 a shallow trench isolation (STI) region encapsulating the superlattice layer;
 a strained layer disposed over the superlattice layer and providing a gate channel, the gate channel stressed by a lattice mismatch with at least one of the first semiconductor layers or the second semiconductor layers of the superlattice layer; and
 a gate stack formed over the strained layer.

14. The device of claim 13, wherein the material of the first semiconductor layers is a first III-V semiconductor material, and the material of the second semiconductor layers is a second III-V semiconductor material.

15. The device of claim 13, wherein the material of the first semiconductor layers is a first silicon germanium alloy, and the material of the second semiconductor layers is a second silicon germanium alloy.

16. A method of forming a stressor for a fin field effect transistor (FinFET) device, comprising:
 constructing alternating first semiconductor layers and second semiconductor layers of a superlattice layer over a fin portion of a substrate, the first semiconductor layers each having a first atomic composition, and the second semiconductor layers each having a second atomic composition different from the first atomic composition, the fin portion of the substrate having a third atomic composition different from both the first atomic composition and the second atomic composition, at least one of the first semiconductor layers or the second semiconductor layers being relaxed; and
 forming a strained layer over the superlattice layer, the strained layer providing a gate channel, the gate channel stressed by a lattice mismatch with at least one of the first semiconductor layers or the second semiconductor layers of the superlattice layer.

17. The method of claim 16, wherein the first atomic composition is a first III-V semiconductor material, and the second atomic composition is a second III-V semiconductor material.

18. The method of claim 16, wherein the first atomic composition is a first silicon germanium alloy, and the second atomic composition is a second silicon germanium alloy.

19. The method of claim 16, further comprising encapsulating the superlattice layer with a shallow trench isolation (STI) region.

20. The method of claim 16, further comprising forming a gate stack over the strained layer.

* * * * *